(12) United States Patent
Huang

(10) Patent No.: US 11,322,471 B2
(45) Date of Patent: May 3, 2022

(54) SEMICONDUCTOR PACKAGE STRUCTURES, SEMICONDUCTOR DEVICE PACKAGES AND METHODS OF MANUFACTURING THE SAME

(71) Applicant: Advanced Semiconductor Engineering, Inc., Kaohsiung (TW)

(72) Inventor: Wen Hung Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 55 days.

(21) Appl. No.: 16/681,500

(22) Filed: Nov. 12, 2019

(65) Prior Publication Data

US 2021/0143119 A1    May 13, 2021

(51) Int. Cl.
*H01L 23/00*    (2006.01)

(52) U.S. Cl.
CPC .............. *H01L 24/20* (2013.01); *H01L 24/19* (2013.01); *H01L 24/82* (2013.01); *H01L 24/95* (2013.01)

(58) Field of Classification Search
CPC ......... H01L 24/95; H01L 24/82; H01L 24/19; H01L 24/20; H01L 23/3128; H01L 24/97; H01L 24/23; H01L 21/6835; H01L 21/568; H01L 24/14; H01L 24/32; H01L 25/105; H01L 23/5226; H01L 21/563
USPC .................................. 257/786; 438/612, 666
See application file for complete search history.

(56) References Cited

U.S. PATENT DOCUMENTS

| | | |
|---|---|---|
| 9,922,917 B2 | 3/2018 | Yu et al. |
| 10,163,858 B1* | 12/2018 | Liu ..................... H01L 23/5226 |
| 10,475,762 B1* | 11/2019 | Yeh ........................ H01L 24/19 |
| 2017/0207197 A1* | 7/2017 | Yu ........................... H01L 24/32 |
| 2017/0338202 A1* | 11/2017 | Tsai ...................... H01L 21/563 |
| 2017/0365580 A1* | 12/2017 | Shih ........................ H01L 24/14 |
| 2019/0139842 A1* | 5/2019 | Chen ..................... H01L 25/105 |
| 2020/0294930 A1* | 9/2020 | Wang ................. H01L 23/49811 |
| 2020/0365539 A1* | 11/2020 | Liang .................... H01L 24/32 |

* cited by examiner

*Primary Examiner* — Didarul A Mazumder
(74) *Attorney, Agent, or Firm* — Foley & Lardner LLP

(57) ABSTRACT

A semiconductor package structure includes a first substrate, a second substrate, a first redistribution layer, and a first reconnection layer. The first substrate may have a first surface. The second substrate can be spaced apart from the first substrate with a gap and may have a second surface. The first redistribution layer can be disposed between the first redistribution layer and the gap. The first substrate can be electrically connected to the second substrate via the first reconnection layer.

18 Claims, 20 Drawing Sheets

SEMICONDUCTOR PACKAGE STRUCTURES, SEMICONDUCTOR DEVICE PACKAGES AND METHODS OF MANUFACTURING THE SAME

BACKGROUND

1. Field of the Disclosure

The present disclosure relates to semiconductor package structures, semiconductor device and methods of manufacturing the same.

2. Description of Related Art

A semiconductor device package includes a semiconductor device attached to a substrate. However, the semiconductor device package may have relatively low yield when the substrate is specified to have a relatively great area.

SUMMARY

According to some example embodiments of the present disclosure, a semiconductor package structure includes a first substrate, a second substrate, a first redistribution layer, and a first reconnection layer. The first substrate has a first surface. The second substrate is spaced apart from the first substrate with a gap and may have a second surface. The first redistribution layer disposed on the first surface and the second surface. The first reconnection layer is disposed between the first redistribution layer and the gap. The first substrate is electrically connected to the second substrate via the first reconnection layer.

According to some example embodiments of the present disclosure, a semiconductor device package includes a first substrate, a second substrate, a reconnection layer, and a redistribution layer. The first substrate has a first terminal. The second substrate has a second terminal and is separated from the first substrate with a space in a first direction. The reconnection layer is disposed on the first substrate and the second substrate. The redistribution layer is disposed on the reconnection layer and includes a first conductive pad and a second conductive pad. A pitch is between the first conductive pad and the second conductive pad in the first direction. A center line of the first terminal and a center line of the second terminal have a distance in the first direction. The distance minus a width of the space substantially equals to the pitch.

According to some example embodiments of the present disclosure, a method of manufacturing a semiconductor device package includes providing one or more mother substrates; singulating the one or more mother substrates into a plurality of substrates; forming a dielectric layer on the plurality of substrates and in a gap between adjacent substrates; forming a first reconnection layer on a first surface of least one of the plurality of substrates; forming a first redistribution layer on the first reconnection layer.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

DETAILED DESCRIPTION

Figure 1A:
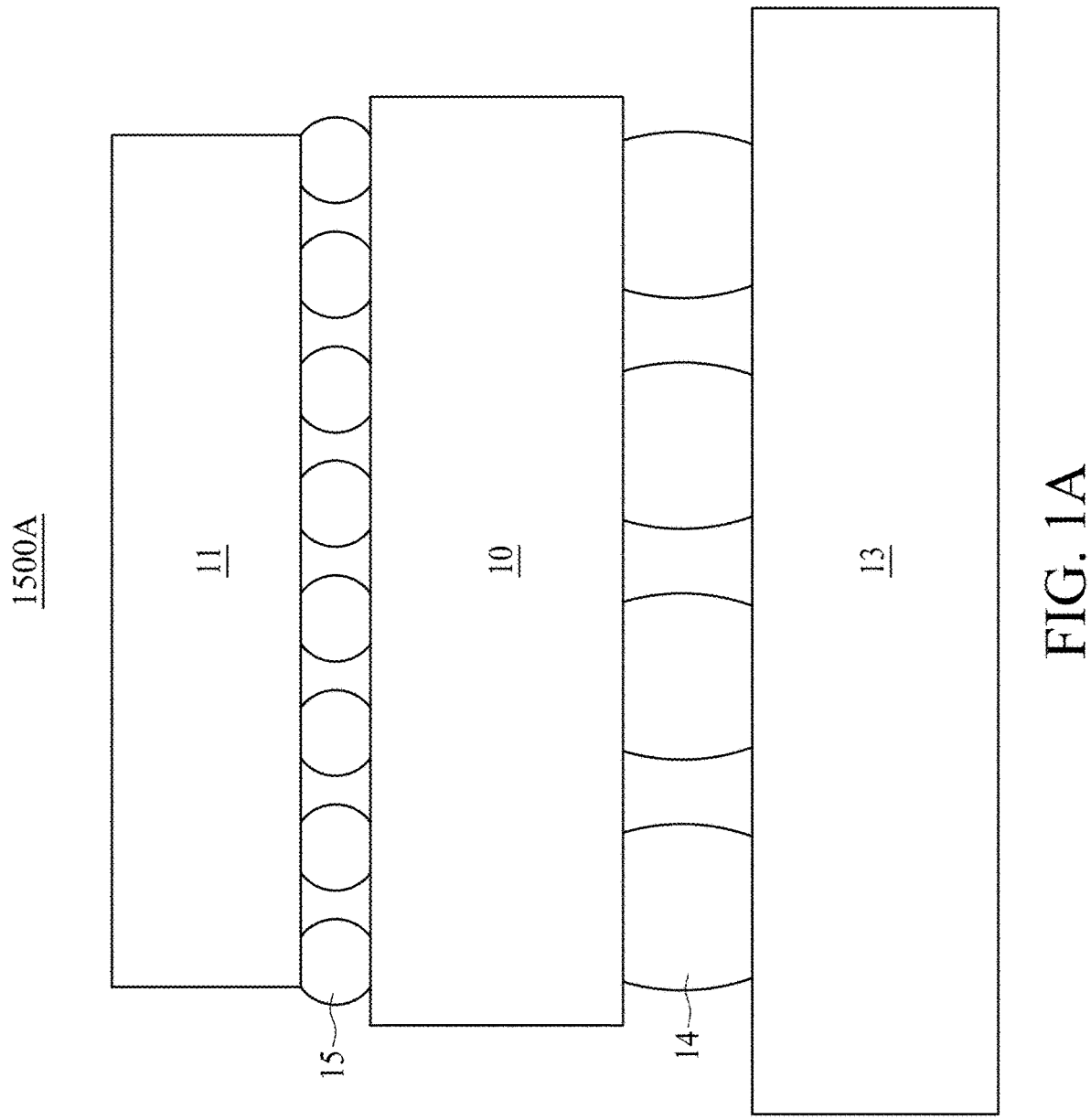
FIG. 1A is a cross-sectional view of a semiconductor device package in accordance with some comparative embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The electronic device packages and manufacturing methods of the present disclosure are not limited to the above-described embodiments, and may be implemented according to other embodiments. To streamline the description and for the convenience of comparison between various embodiments of the present disclosure, similar components the following embodiments are marked with same numerals, and may not be redundantly described.

FIG. 1A is a cross-sectional view of a semiconductor device package 1500A in accordance with an embodiment of the present disclosure. The semiconductor device package 1500A includes a substrate 10, a semiconductor device 11, a carrier 13, and interconnections 14 and 15.

The substrate 10 is disposed on the carrier 13. The substrate 10 is bonded to the carrier 13 by the interconnections 14. The substrate 10 may include a circuitry which can realize a relatively complete function. The semiconductor device 11 is disposed on the substrate 10. The semiconductor device 11 can be bonded to the substrate 10 by the interconnections 15. The carrier 13 may include, for example, a printed circuit board (PCB), such as a paper-based copper foil laminate, a composite copper foil laminate, or a polymer-impregnated glass-fiber-based copper foil laminate. The interconnections 14 and the interconnections 15 each may include, for example but is not limited to, solder, adhesive (which may include conductive adhesive (e.g. resin mixed with conductive particles)), or other suitable bonding material(s).

Figure 1B:
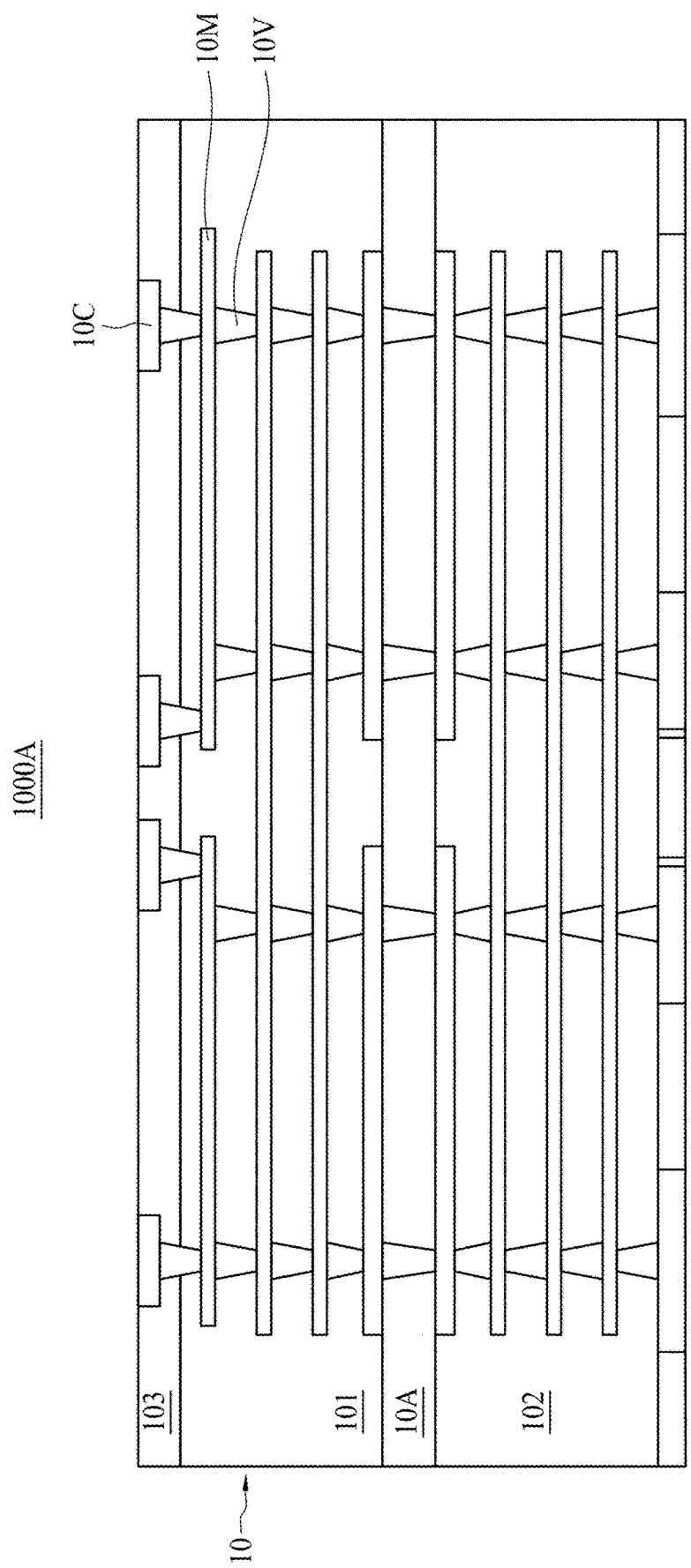
FIG. 1B is a cross-sectional view of a semiconductor package structure in accordance with some comparative embodiments of the present disclosure.

FIG. 1B is a cross-sectional view of a semiconductor package structure 1000A in accordance with an embodiment of the present disclosure. In some embodiments, the substrate 10 may include a package substrate with circuitry therein. The substrate 10 may include a core substrate, which includes a core layer 10A and a plurality of dielectric layers 101, 102 disposed on opposite sides of the core layer 10A. A passivation layer 103 is disposed on the dielectric layer 101.

A plurality of conductive layers 10M are embedded in the dielectric layers 101, 102. The plurality of conductive layers 10M are connected to each other by a plurality of conductive vias 10V. The plurality of conductive vias 10V are embedded in the core layer 10A to connect the conductive layers 10M in the dielectric layer 101 to the conductive layers 10M in the dielectric layer 102. The dielectric layer 101 may include, but is not limited to, molding compounds or pre-impregnated composite fibers (e.g., pre-preg). The material of the dielectric layer 102 may be similar to that of the dielectric layer 101.

The passivation layer 103 includes a plurality of conductive pads 10C connected with the conductive vias 10V. In some embodiments, the conductive pads 10C may be electrically connected to a semiconductor device. An example of the material of passivation layer 103 may include epoxy.

Figure 1C:
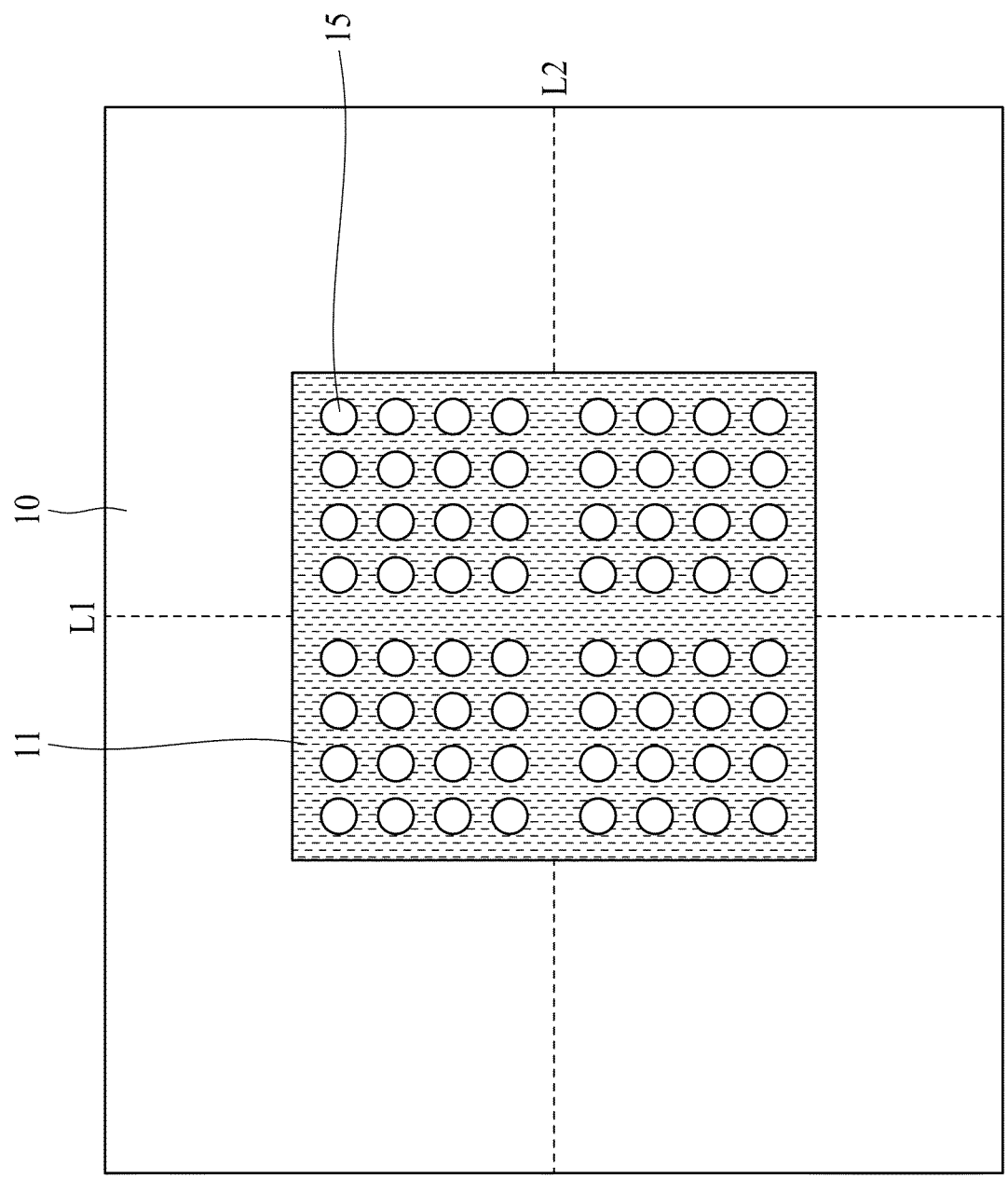
FIG. 1C is a perspective view of the semiconductor device package in FIG. 1A.

FIG. 1C is a perspective view of the semiconductor device package 1500A in FIG. 1A. The semiconductor device 11 is disposed symmetrically with respect to a vertical line L1 and a horizontal line L2. The interconnections 15 are aligned to a plurality of conductive pads of the semiconductor device 11.

In some applications, the size (or the area) of the semiconductor device 11 is relatively large, so that the specified size of the substrate 10 for packaging the semiconductor device 11 is larger correspondingly. As the size of the substrate 10 enlarges, the manufacturing yield of the substrate 10 is lowered. In addition, as the circuitry of the substrate 10 is complicated, the manufacturing yield of the substrate 10 is lowered. Therefore, the semiconductor device package 1500A may have relatively great cost.

To address the above concern, embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

Figure 2A:
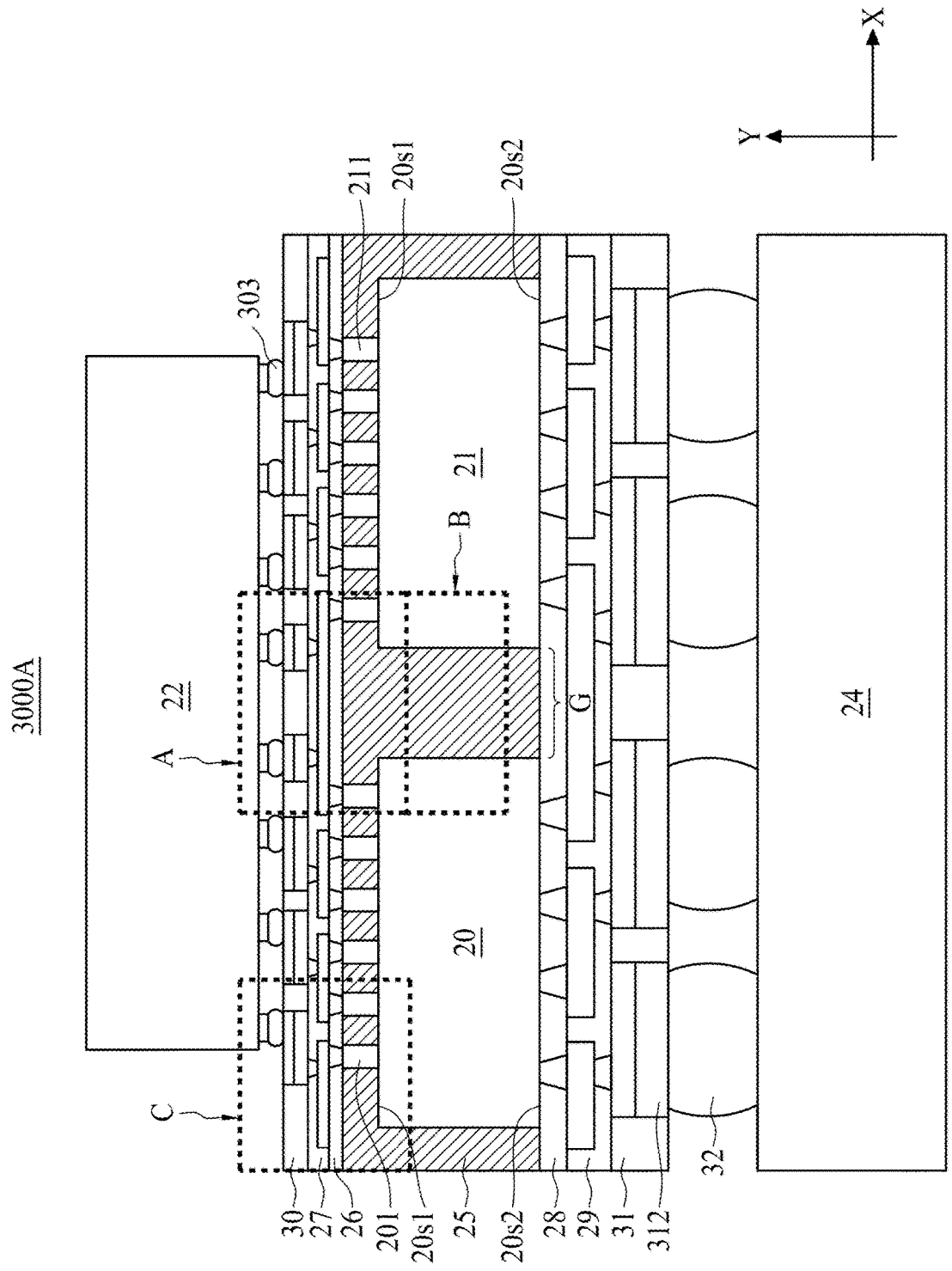
FIG. 2A is a cross-sectional view of a semiconductor device package in accordance with some embodiments of the present disclosure.
Figure 2B:
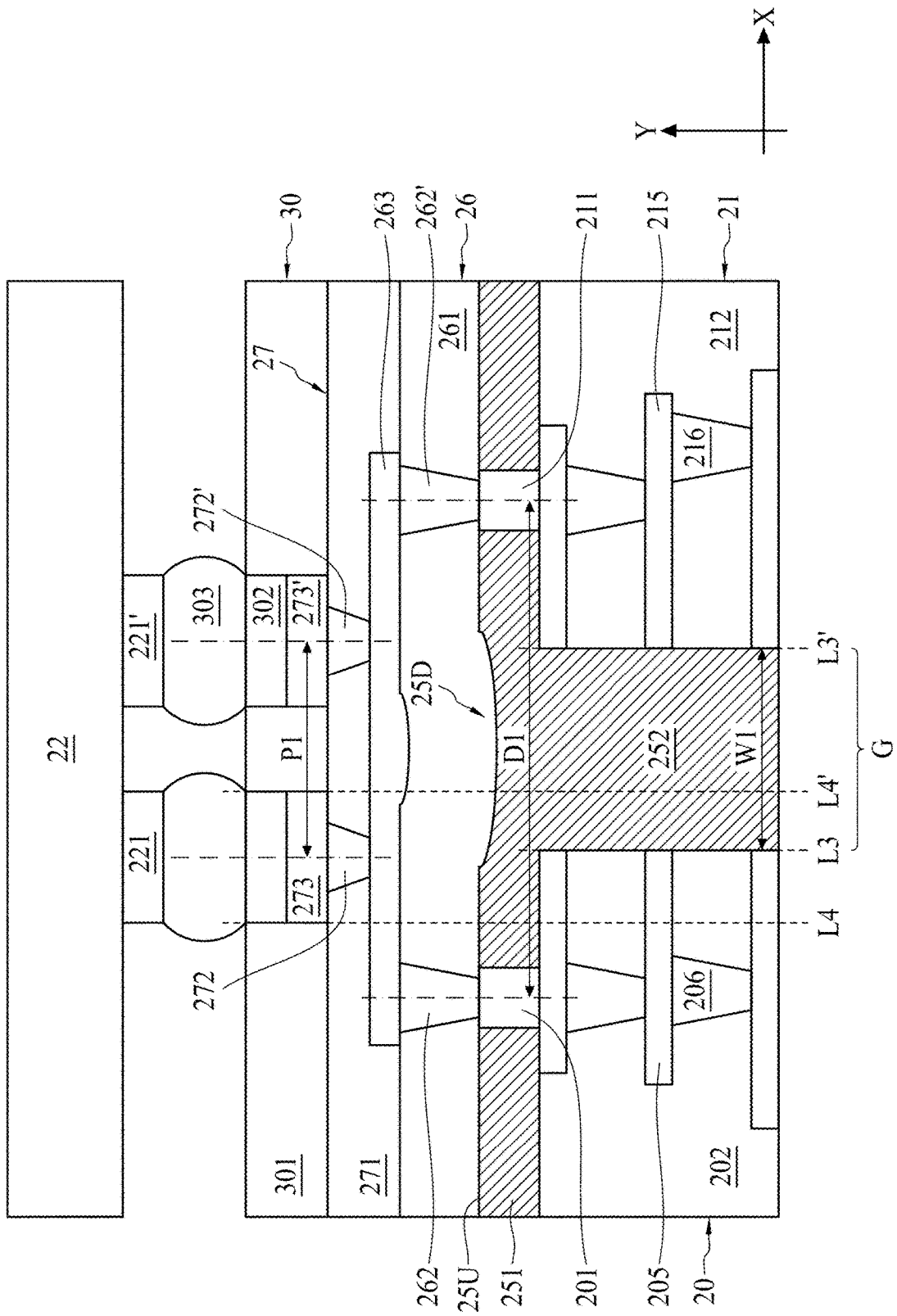
FIG. 2B is an enlarged view of the structure in dotted block A as shown in FIG. 2A.

FIG. 2A is a cross-sectional view of a semiconductor device package 3000A in accordance with some embodiments of the present disclosure, and FIG. 2B is an enlarged view of the semiconductor package structure in dotted block A as shown in FIG. 2A. As shown in FIG. 2A and FIG. 2B, the semiconductor device package 2000A includes a first substrate 20, a second substrate 21, a first semiconductor device 22, a carrier 24, an dielectric layer 25, a first reconnection layer 26, a first redistribution layer 27, a second reconnection layer 28, and a second redistribution layer 29, a first passivation layer 30, a second passivation layer 31, a plurality of interconnections 32.

The first substrate 20 is disposed on the carrier 24, and may be surrounded by the dielectric layer 25. The first substrate 20 may be substantially leveled with the second substrate 21, e.g., the first substrate 20 and the second substrate 21 may be disposed at the same horizontal level. The first substrate 20 has a first surface 20s1, and the first surface 20s1 may be in contact with the dielectric layer 25. The first substrate 20 may be, or includes, a package substrate or a printed circuit board, such as a paper-based copper foil laminate, a composite copper foil laminate, or a polymer-impregnated glass-fiber-based copper foil laminate. Alternatively, The substrate 20 may be, or includes, an organic substrate including organic molecules or polymers, such as pentacene. In addition, The first substrate 20 may include an interconnection structure, such as a redistribution layer (RDL).

Referring to FIG. 2B, the first substrate 20 includes a first dielectric layer 202, a first conductive layer 205, and a conductive via 206. The first conductive layer 205 is embedded in the dielectric layer 202. The first conductive layer 205 may be in contact with the portion 252. The first conductive layer 205 is connected to the conductive via 206. The second substrate 21 includes a dielectric layer 212, a second conductive layer 215 and a second conductive via 216 connected to the second conductive layer 215. The second conductive layer 215 is in contact with the portion 252. In some embodiments, the first conductive layer 205 can be leveled with the second conductive layer 215 along a horizontal line L5. In some embodiments, the first conductive layer 206 and the second conductive layer 206 may collectively form a complete circuit function prior to the partition process. The material of the dielectric layers 202, 212 may each include, but is not limited to, molding compounds or pre-impregnated composite fibers (e.g., pre-preg), a borophosphosilicate glass (BPSG), a silicon oxide, a silicon nitride, a silicon oxynitride, an undoped silicate glass (USG), any combination thereof, or the like. The material of the conductive layers 205, 215 may each include, for example but is not limited to, nickel, copper, gold, platinum or other suitable metal material(s). The material of the conductive vias 206, 216 may each include, for example but is not limited to, nickel, copper, gold, platinum or other suitable metal material(s).

The second substrate 21 is disposed on the carrier 24, and may be surrounded by the dielectric layer 25. The second substrate 21 may have a second surface 21s1. The second surface 21s1 is in contact with the dielectric layer 25. The second substrate 21 is spaced apart from the first substrate 20 with a gap G (or a space). The gap G may be measured by a distance between respective edges of the first substrate 20 and the second substrate 21. The gap G has a width W1 in the first direction. In some embodiments, the gap G can be filled with a dielectric material to form the portion 252. In some embodiments, the second substrate 21 may have structures, elements, or material similar to or different from the first substrate 20. In some embodiments, the dielectric layer 25 may include a dimple 25D recessed from an upper surface 25U of the dielectric layer 25 and over the gap G. The dimple 25D may be formed due to the profile of the gap G, the first substrate 20 and the second substrate 21.

The first semiconductor device 22 is disposed on the first substrate 20 and the second substrate 21. The first semiconductor device 22 is disposed on the first redistribution layer 27. The first semiconductor device 22 is attached to or bonded on the passivation layer 30 by a connection element 303. The material of semiconductor device 22 may include, for example but is not limited to, a processor, a controller (e.g. a memory controller), a microcontroller (MCU), a memory die or other electronic component(s).

The first substrate 20 and the second substrate 21 are attached or bonded to the carrier 24 by the plurality of connection elements 32. The material of carrier 24 may be, or include, a PCB, such as a paper-based copper foil laminate, a composite copper foil laminate, or a polymer-impregnated glass-fiber-based copper foil laminate. The material of plurality of connection elements 32 may include, for example but is not limited to, solder, adhesive (which may include conductive adhesive (e.g. resin mixed with conductive particles)), or other suitable bonding material(s).

The dielectric layer 25 is disposed on the first surface 20s1 and the second surface 21s1. The dielectric layer 25 includes a portion 251 surrounding the first substrate 20 and the second substrate 21. The dielectric layer 25 includes a portion 252 disposed in the gap G between the first substrate 20 and the second substrate 21. The material of the dielectric layer 25 can include epoxy. The material of dielectric layer 25 may include flow-able material such as underfill material, molding compound (e.g. epoxy molding compound (EMC) or encapsulation material.

The first reconnection layer 26 is disposed on the dielectric layer 25. The first reconnection layer 26 is disposed between the first redistribution layer 27 and the gap G. The first reconnection layer 26 is disposed across the portion 252 of the dielectric layer 25. The first reconnection layer 26 may be in contact with the dielectric layer 25. The first reconnection layer 26 is disposed on the first substrate 20 and the second substrate 21. The first reconnection layer 26 can be electrically connected to the first substrate 20 through the first terminal 201 disposed on the first surface 20s1. For example, the first terminal 201 is connected to the first conductive layer 206. The first reconnection layer 26 can be electrically connected to the second substrate 21 through the second terminal 211 disposed on the second surface 21s1. For example, the second terminal 211 is connected to the second conductive layer 216. The first terminal 201 can be surrounded by the portion 251. The second terminal 211 can be surrounded by the portion 251.

The first distribution layer 27 is disposed on and electrically connected to the first reconnection layer 26. The first distribution layer 27 is disposed on the first surface 20s1 and the second surface 21s1. The first redistribution layer 27 is disposed across the gap G. The first distribution layer 27 is disposed across the portion 252 of the dielectric layer 25. The first distribution layer 27 is disposed on the first substrate 20.

The second reconnection layer 28 is disposed on a third surface 20s2 of the first substrate 20 and on a fourth surface 21s2 of the second substrate 21. The second reconnection layer 28 is disposed between the second redistribution layer 29 and at least one of the third surface 20s2 and the fourth surface 21s2. The second redistribution layer 29 is disposed across the gap G. In some embodiments, the second reconnection layer 28 can be electrically connected to the first substrate 20 and the second substrate 21. The second distribution layer 29 is disposed on and electrically connected to the second reconnection layer 28. The second distribution layer 29 is disposed on the third surface 20s2 and the fourth surface 21s2.

The first passivation layer 30 is disposed on the first redistribution layer 27. The first passivation layer 30 is disposed between the first semiconductor device 22 and the first redistribution layer 27. A conductive element 303 may be disposed in the first passivation layer 30 to electrically connect the first semiconductor device 22 to the first redistribution layer 27. The second passivation layer 31 is disposed between the second redistribution layer 29 and the carrier 24. A conductive element 312 may be disposed in the second passivation layer 31 to electrically connect the carrier 24 to the second redistribution layer 29. The first and second passivation layers 30, 31 may each include epoxy, solder mask, liquid photoimageable solder mask (LPSM or LPI) inks, or dry-film photoimageable solder mask (DFSM). The conductive element 303 may include, for example but is not limited to, nickel, copper, gold, platinum or other suitable metal material(s).

In some embodiment, the first substrate 20 and the second substrate 21 may be singulated from one or more mother substrates. The first substrate 20 and the second substrate 21 may be partitioned substrates which includes circuit with incomplete function. As illustrate in FIG. 2A, the first substrate 20 and the second substrate 21 the (partitioned substrates) are joined by the dielectric layer 25. The first substrate 20 may have a first projected area and the second substrate 21 may have a second projected area. The first semiconductor device 22 may have a third projected area overlapping with the first projected area and the second projected area. In some embodiments. the semiconductor device covers a portion of the first substrate 20 and a portion of the second substrate 21 in the second direction Y substantially perpendicular to the first direction X. In the partition process, some interconnection structures (e.g., conductive layers, conductive vias, or conductive pads) embedded in the mother substrates may be cut off. As a result, the interconnection structures in the partitioned substrates may be disconnected. To address the above issues, the reconnection layer 26 provides a function for reconnecting the disconnected interconnection structures. The detailed descriptions are set out at the embodiment of FIG. 2B.

The first reconnection layer 26 is disposed across the gap G. The first reconnection layer 26 includes a dielectric layer 261, conductive vias 262 and 262', and a first wiring structure 263. The dielectric layer 261 is in contact with the portions 251 and 252. As described, a dimple 25D may appear in the upper surface 25U of the dielectric layer 25 due to the profile of the gap G, the first substrate 20 and the second substrate 21. In some embodiments, the depth of the dimple 25D is controlled to be as shallow as possible, such that the overlying dielectric layer 261 can have relatively surface uniformity to prevent the overlying first wiring structure 263 from electrical issue such as open-circuitry. By way of example, the depth of the dimple 25D can be controlled to be, but is not limited to be, less than about 1 micrometer. The first wiring structure 263 is disposed across the gap G. The first terminal 201 is electrically connected to the first wiring structure 263 by the conductive via 262. The second terminal 211 is electrically connected to the first wiring structure 263 by the conductive via 262'. Consequently, the first wiring structure 263 can provide a function a reconnection between the first conductive layer 205 and the second conductive layer 215. Thus, the first substrate 20 and the second substrate 21, which are electrically connected via the first reconnection layer 26, collectively form a circuit with a relatively complete function. The first reconnection layer 26 reconnects the disconnected interconnection structures (e.g., the first conductive layer 206 or the second conductive layer 216) to restore their functions. In some embodiments, the first reconnection layer 26 can reconnect some intact interconnection structures.

The dielectric layer 261 may include, but is not limited to, molding compounds or pre-impregnated composite fibers (e.g., pre-preg), a borophosphosilicate glass (BPSG), a silicon oxide, a silicon nitride, a silicon oxynitride, an undoped silicate glass (USG), any combination thereof, or the like. The conductive via 262 may include, for example but is not limited to, nickel, copper, gold, platinum or other suitable metal material(s). The wiring structure 263 may include, for example but is not limited to, nickel, copper, gold, platinum or other suitable metal material(s).

Referring to FIG. 2B, the first semiconductor device 22 have third and fourth conductive pads 221 and 221'. The third and fourth conductive pads 221 and 221' have a pitch predetermined in the manufacture of the first semiconductor device 22. On the other hand, a center line of the first terminal 201 and a center line of the second terminal 211 have a distance D1 in a first direction X since the first substrate 20 and the second substrate 21 are separated by the gap G with the width W1. The predetermined pitch is smaller than the distance D1, so that the first terminal 201 is misaligned with the third conductive pad 221 in the second direction Y and the second terminal 211 is misaligned with the fourth conductive pad 221' in second direction Y. The first redistribution layer 27 provides a redistribution structure for connecting the third and fourth conductive pads 221, 221' to the first and second terminals 201, 211, respectively. The redistribution structure includes conductive vias 272 and 272', a first conductive pad 273, and a second conductive pad 273'. The first conductive pad 273 is electrically connected with the third conductive pad 221 by the connection element 303. The first conductive pad 273 is electrically connected with the first terminal 201 by, in sequence, the conductive via 262, the wiring structure 263, the conductive via 272. Consequently, the third conductive pad 221 is electrically connected with the first terminal 201 by the redistribution structure of the first redistribution layer 27. The fourth conductive pad 221' may be electrically connected with the second terminal 211 in a manner similar to the third conductive pad 221.

The second conductive pad 273' and the first conductive pad 273 have a pitch P1 in the first direction. The pitch P1 corresponds to the predetermined pitch. The pitch P1 may be measured by a distance between a central line of the first conductive pad 273 and a central line of the second conductive pad 273'. In some embodiment, the pitch P1 may be substantially the same as the predetermined pitch. In some embodiments, the distance D1 and the width W1 may have a mathematical relation with the pitch P1. In some embodiments, the distance D1 minus the width W1 substantially equals to the pitch P1.

In some embodiments, the gap G may have a fourth projected area between lines L3 and L3'. The first conductive pad 273 may have a fifth projected area between lines L4 and L4'. The second projected area overlaps with the first projected area.

The redistribution layer 27 further includes a dielectric layer 271 which may be similar to or different from the dielectric layer 261. The material of the conductive via 272 may include, for example but is not limited to, nickel, copper, gold, platinum or other suitable metal material(s). The material of the conductive layer 273 may include, for example but is not limited to, nickel, copper, gold, platinum or other suitable metal material(s).

Figure 2C:
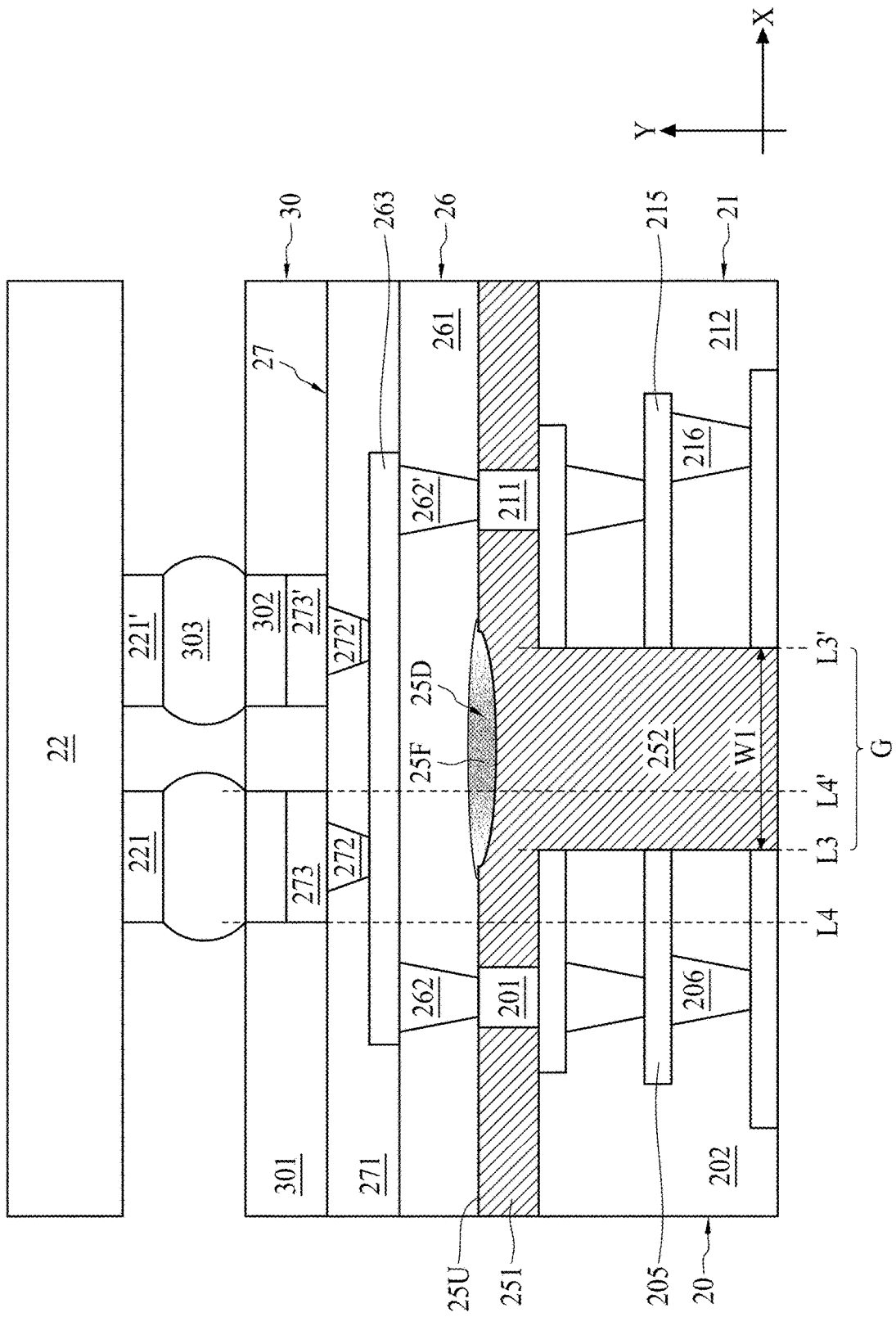
FIG. 2C is an enlarged view of the structure in dotted block A as shown in FIG. 2A according some alternative embodiments of the present disclosure.

FIG. 2C is an enlarged view of the structure in dotted block A as shown in FIG. 2A according some alternative embodiments of the present disclosure. As shown in FIG. 2C, a filling material 25F may be filled in the dimple 25D to increase the surface uniformity of the overlying dielectric layer 261. The filling material 25F may include a dielectric material such as a flow-able dielectric material.

Figure 2D:
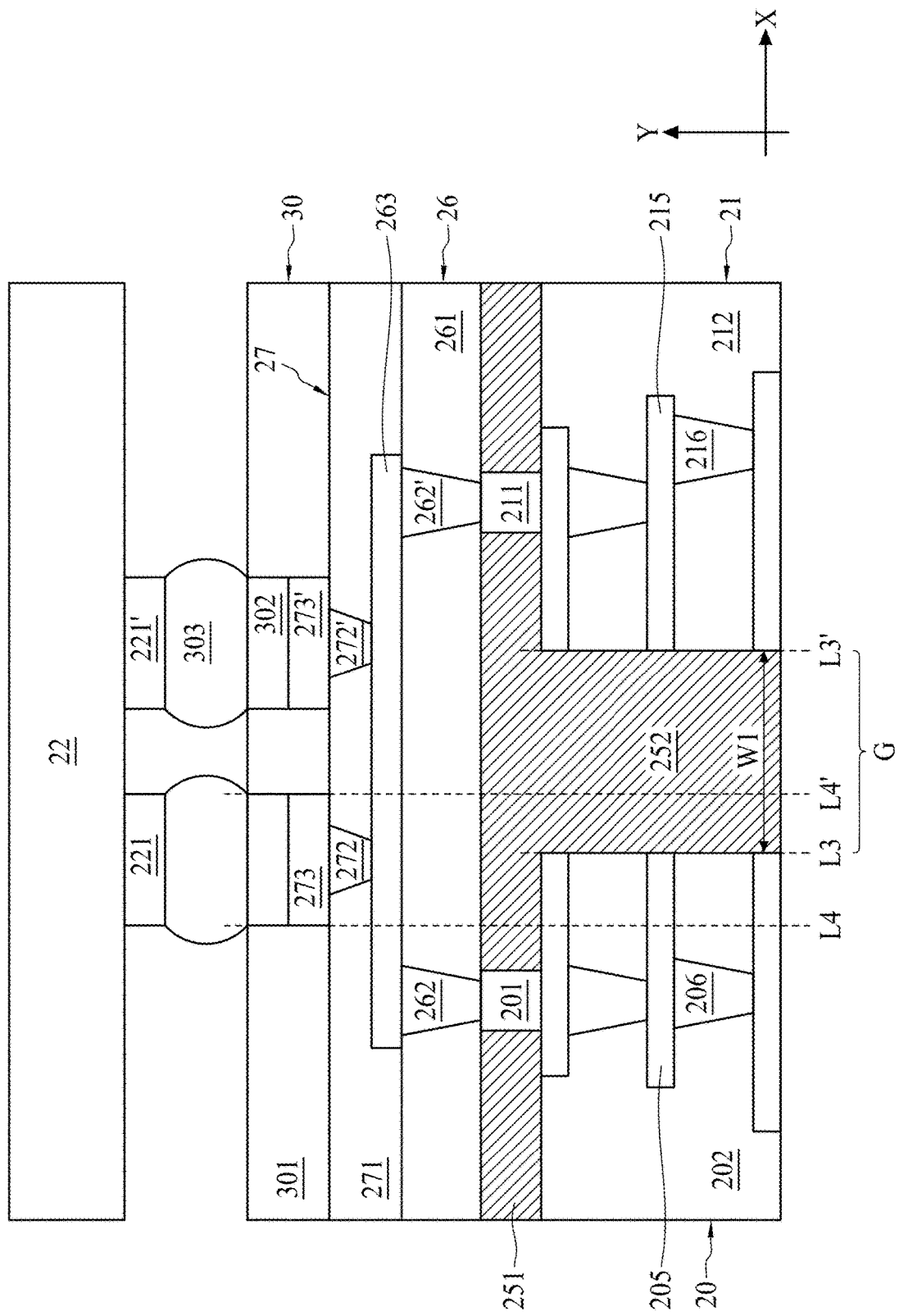
FIG. 2D is an enlarged view of the structure in dotted block A as shown in FIG. 2A according some alternative embodiments of the present disclosure.

FIG. 2D is an enlarged view of the structure in dotted block A as shown in FIG. 2A according some alternative embodiments of the present disclosure. As shown in FIG. 2D, the upper surface 25U of the dielectric layer 25 may include a smooth surface. In some embodiments, the dielectric layer 25 may be planarized by, e.g., a polishing process before formation of the first reconnection layer 26.

Figure 2E:
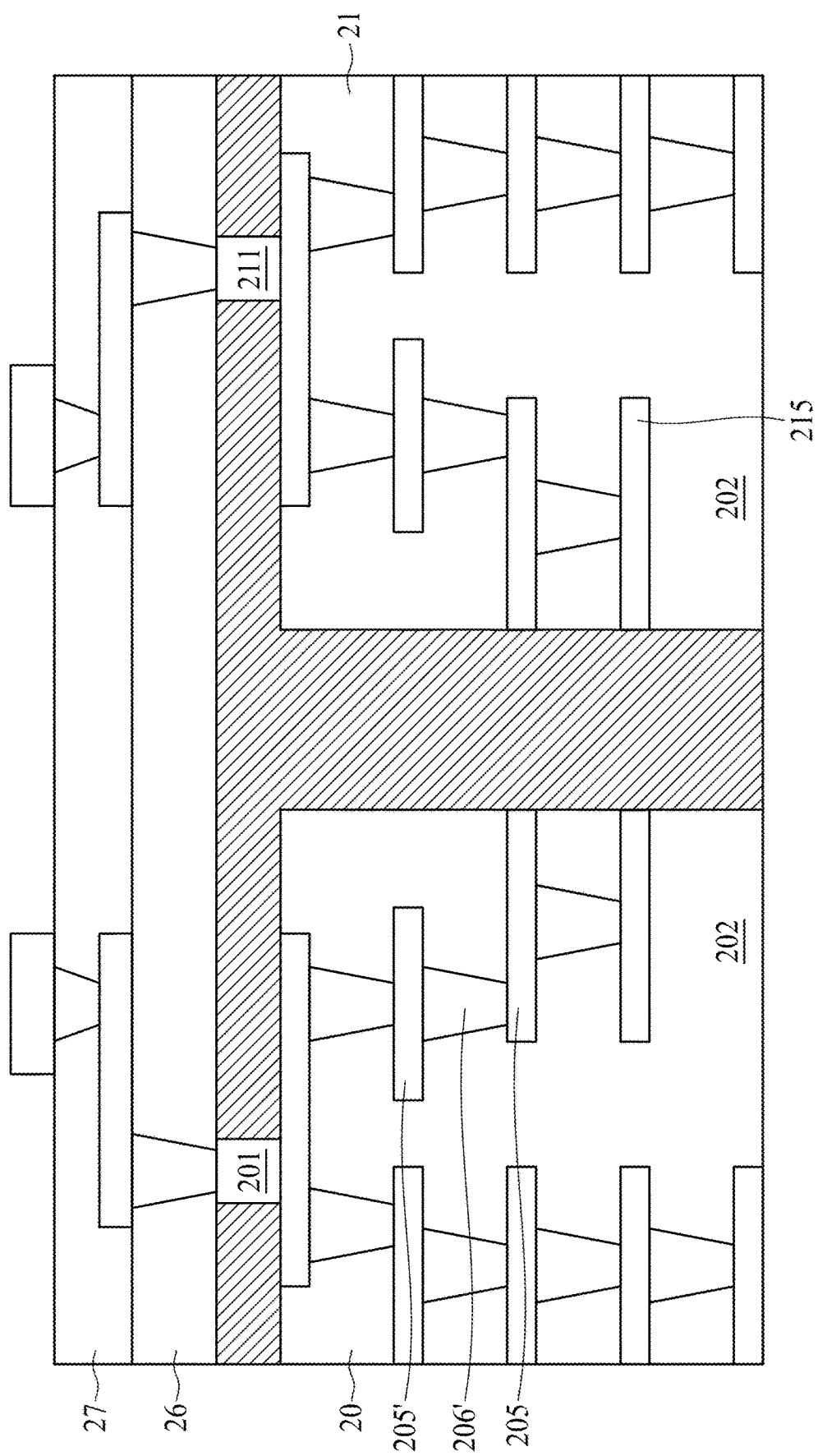
FIG. 2E is another enlarged view of the structure in dotted block A as shown in FIG. 2A.

FIG. 2E is another enlarged view of a structure in dotted block A as shown in FIG. 2A. Referring to FIG. 2E, the conductive layer 205 is connected to an intact conductive layer 205' by a conductive via 206'. The conductive layer 205' is electrically connected to the first terminal 201. The first terminal 201 is electrically connected to the first reconnection layer 26 and the first redistribution layer 27. The intact conductive layer 205' remains intact in the partition process. The first conductive layer 205 is reconnected to the second conductive layer 215 by the intact conductive layer 205' instead of the wiring structure 263 as illustrated in FIG. 2B.

Figure 2F:
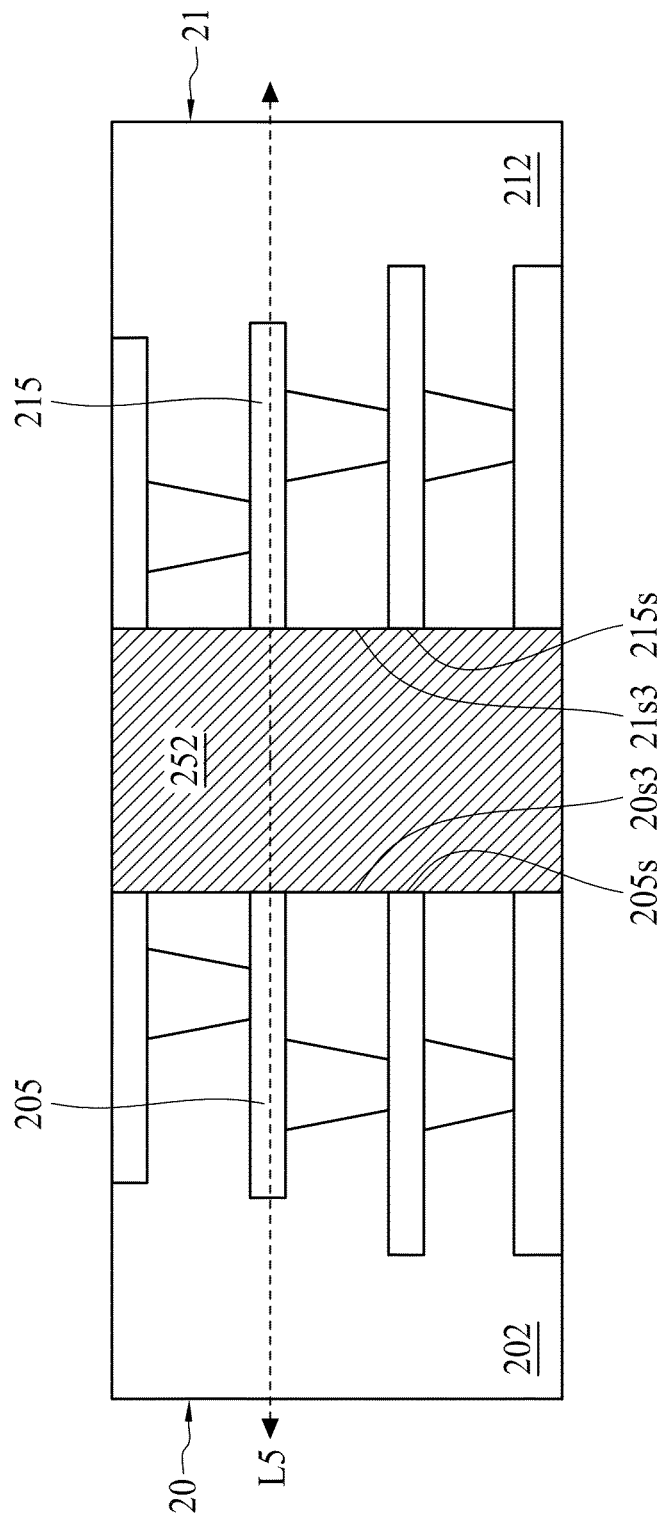
FIG. 2F is an enlarged view of the structure in dotted block B as shown in FIG. 2A.

FIG. 2F is an enlarged view of a structure in dotted block B as shown in FIG. 2A. Referring to FIG. 2F, the first substrate 20 has an inner lateral surface 20s3. The first conductive layer 205 is exposed from the inner lateral surface 20s3. The conductive layer 205 has an outer lateral surface 205s (e.g., an edge). The inner lateral surface 20s3 and the outer lateral surface 205s are substantially coplanar. The outer lateral surface 205s or the edge 205s is in contact with the portion 252 of the dielectric layer 25.

The second substrate 21 has an inner lateral surface 21s3. The second conductive layer 215 is exposed from the inner lateral surface 21s3. The conductive layer 215 has an outer lateral surface 215s (e.g., an edge). The inner lateral surface 21s3 and the outer lateral surface 215s are substantially coplanar. The outer lateral surface 215s (e.g., the edge) is in contact with the portion 252 of the dielectric layer 25.

Figure 2G:
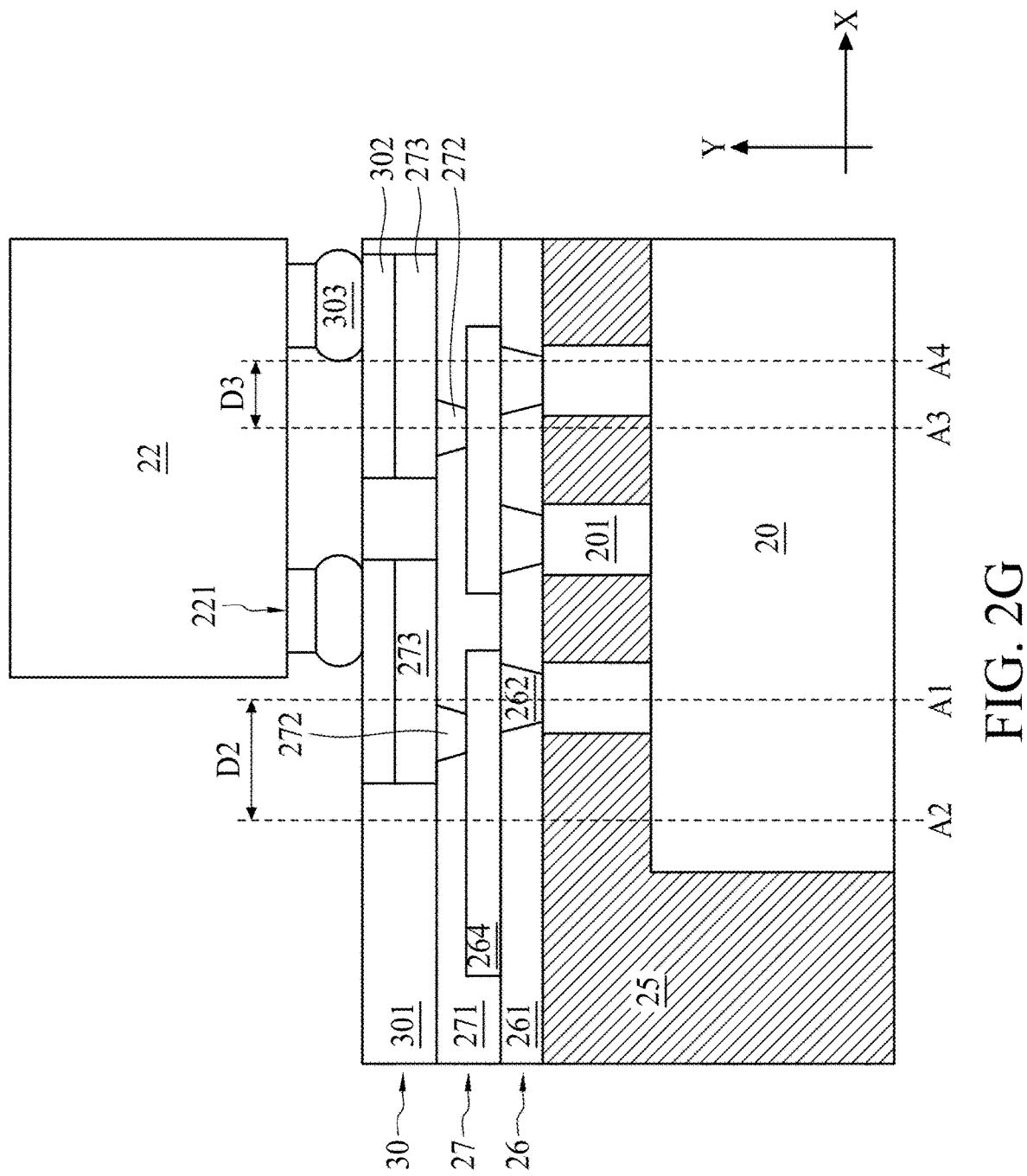
FIG. 2G is an enlarged view of the structure in dotted block C as shown in FIG. 2A.

FIG. 2G is an enlarged view of the semiconductor package structure in dotted block C as shown in FIG. 2A. The first reconnection layer 26 further includes a conductive via 262' and a conductive layer 264. The conductive via 262' extends in a first axis A1. The conductive layer 264 having a center line in a second axis A2. The first axis A1 is substantially parallel to the second axis A2 in the second direction. The first axis A1 is shifted from the second axis A2 with a distance D2 in the first direction X. The second axis A2 is relatively farther away from the first substrate 20 than the first axis A1 in the first direction. In some embodiments, the reconnection layer 26 may be a fan-out structure.

The conductive via 272 extends in a third axis A3. The conductive layer 273 having a center line in a fourth axis A4.

The third axis A3 is substantially parallel to the fourth axis A4 in the second direction. The third axis A3 is shifted from the fourth axis A4 with a distance D3 in the first direction. The fourth axis A4 is relatively nearer to the first semiconductor device 22 than the third axis A3 in the first direction. In some embodiments, the redistribution layer 27 may be a fan-in structure. The first redistribution layer 27 can provides the function of connection between the first semiconductor device 22 and the first substrate 20. The first redistribution layer 27 can provides the function of the connection between the first semiconductor device 22 and the second substrate 21.

Figure 3A:
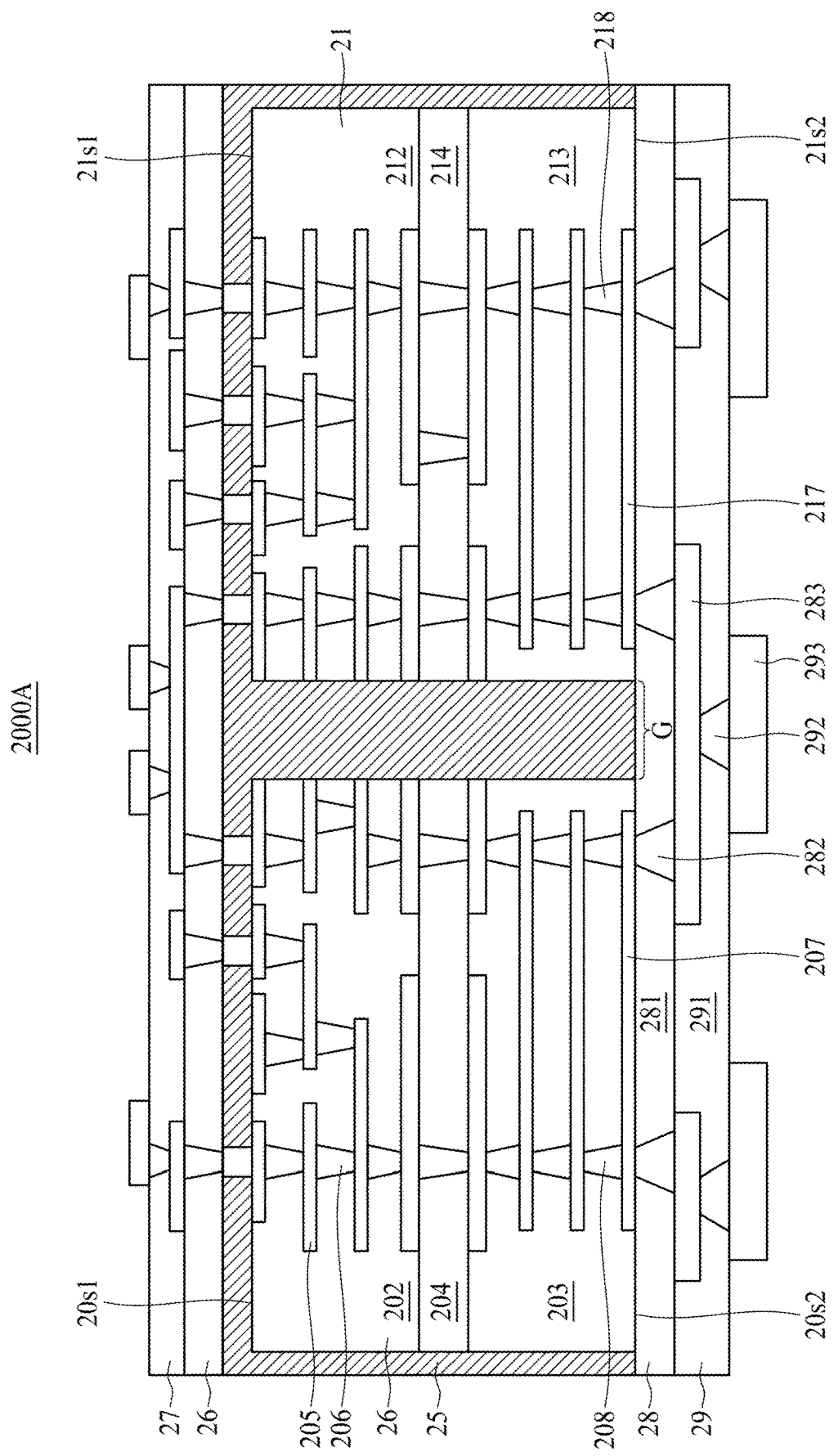
FIG. 3A is a cross-sectional view of a semiconductor package structure in accordance with some embodiments of the present disclosure.

FIG. 3A is a cross-sectional view of a semiconductor package structure 2000A in accordance with some embodiments of the present disclosure. The semiconductor package structure 2000A includes the first substrate 20, the second substrate 21, the dielectric layer 25, the first reconnection layer 26, the first redistribution layer 27, the second reconnection layer 28, and the second redistribution layer 29. FIG. 3A depicts a detailed structural diagram of the first substrate 20 and the second substrate 21 as illustrated in FIG. 2A. The first substrate 20 further includes a dielectric layer 203, a core layer 204, a third conductive layer 207, a third conductive via 208.

The dielectric layer 202 and the dielectric layer 203 may be disposed on opposite sides of the core layer 204. The third conductive layer 207 and the third conductive via 208 may be disposed in the dielectric layer 203. The dielectric layer 203 may include structures, elements, or materials similar to the dielectric layer 202. In some embodiments, the third conductive layer 207 and the third conductive via 208 disposed in the dielectric layer 203 may have relatively great dimension than the first conductive layer 205 and first conductive via 206 disposed in the dielectric layer 202. The conductive layer 205 is electrically connected with the conductive layer 207 by the conductive via 206 penetrating the core layer 204.

In some embodiments, the second substrate 21 may have structures, elements, or material similar to the first substrate 20. The second substrate 21 may have structures, elements, or material different from the first substrate 20.

The second reconnection layer 28 is disposed across the gap G. The second reconnection layer 28 includes a dielectric layer 281, conductive vias 282 and 282', and a second wiring structure 283. The dielectric layer 281 is in contact with the portion 252. The second wiring structure 283 is disposed across the gap G. The third conductive layer 207 is electrically connected to the second wiring structure 283 by the conductive via 282. The fourth conductive layer 217 is electrically connected to the second wiring structure 283 by the conductive via 282'.

The wiring structure 283 can provide a function of the reconnection between the first conductive layer 207 and the second conductive layer 217. The first substrate 20 and the second substrate 21, which are electrically connected via the second reconnection layer 28, collectively form a circuit with a relatively complete function. The first reconnection layer 28 reconnects the disconnected interconnection structures (e.g., the third conductive layer 205, the second conductive layer 215, the third conductive layer 207 or the fourth conductive layer 217) to restore their functions. In some embodiments, the second reconnection layer 28 can reconnect some intact interconnection structures. In some embodiments, the reconnection layer 26 may be a fan-out structure The material of the dielectric layer 281 may include, but is not limited to, molding compounds or pre-impregnated composite fibers (e.g., pre-preg), a borophosphosilicate glass (BPSG), a silicon oxide, a silicon nitride, a silicon oxynitride, an undoped silicate glass (USG), any combination thereof, or the like. The conductive via 282 may include, for example but is not limited to, nickel, copper, gold, platinum or other suitable metal material(s). The material of the wiring structure 283 may include, for example but is not limited to, nickel, copper, gold, platinum or other suitable metal material(s).

The conductive layer 208 may be misaligned with a connection element (e.g., a solder) of a carrier (not shown). The second redistribution layer 29 provide a redistribution structure including conductive vias 292, a fifth conductive pad 293 to connect the conductive layer 208 and the connection element. The fifth conductive pad 293 is electrically connected with the connection element (not shown). The fifth conductive pad 293 is electrically connected with the conductive layer 208, in sequence, by the conductive via 292, wiring structure 283, and the conductive via 282. Consequently, the connection element is electrically connected with the conductive layer 208 by the redistribution structure of the second redistribution layer 29. In some embodiments, the second redistribution layer 29 may be a fan-in structure.

The dielectric layer 291 may be similar to the dielectric layer 281. The conductive via 292 may include, for example but is not limited to, nickel, copper, gold, platinum or other suitable metal material(s). The conductive layer 293 may include, for example but is not limited to, nickel, copper, gold, platinum or other suitable metal material(s).

Figure 3B:
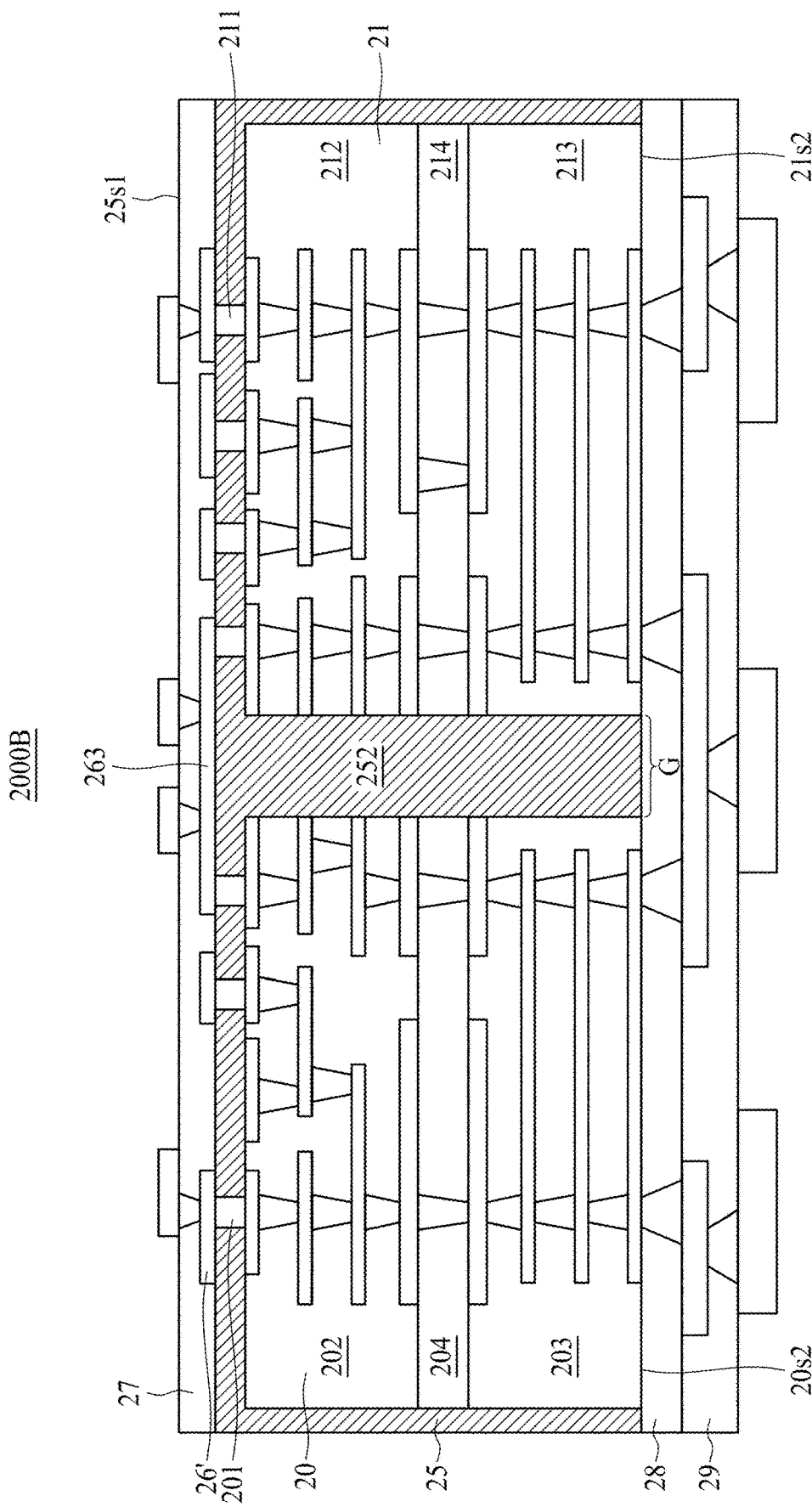
FIG. 3B is a cross-sectional view of a semiconductor package structure in accordance with some embodiments of the present disclosure.

FIG. 3B is a cross-sectional view of a semiconductor package structure 2000B in accordance with some embodiments of the present disclosure. Referring to FIG. 3B, in contrast to the semiconductor package structure 2000A in FIG. 3A, the wiring structure 263 of the semiconductor package structure 2000B is disposed across the gap G and in contact with the dielectric layer 25. The wiring structure 263 traverses through a surface of the dielectric layer 25.

Figure 3C:
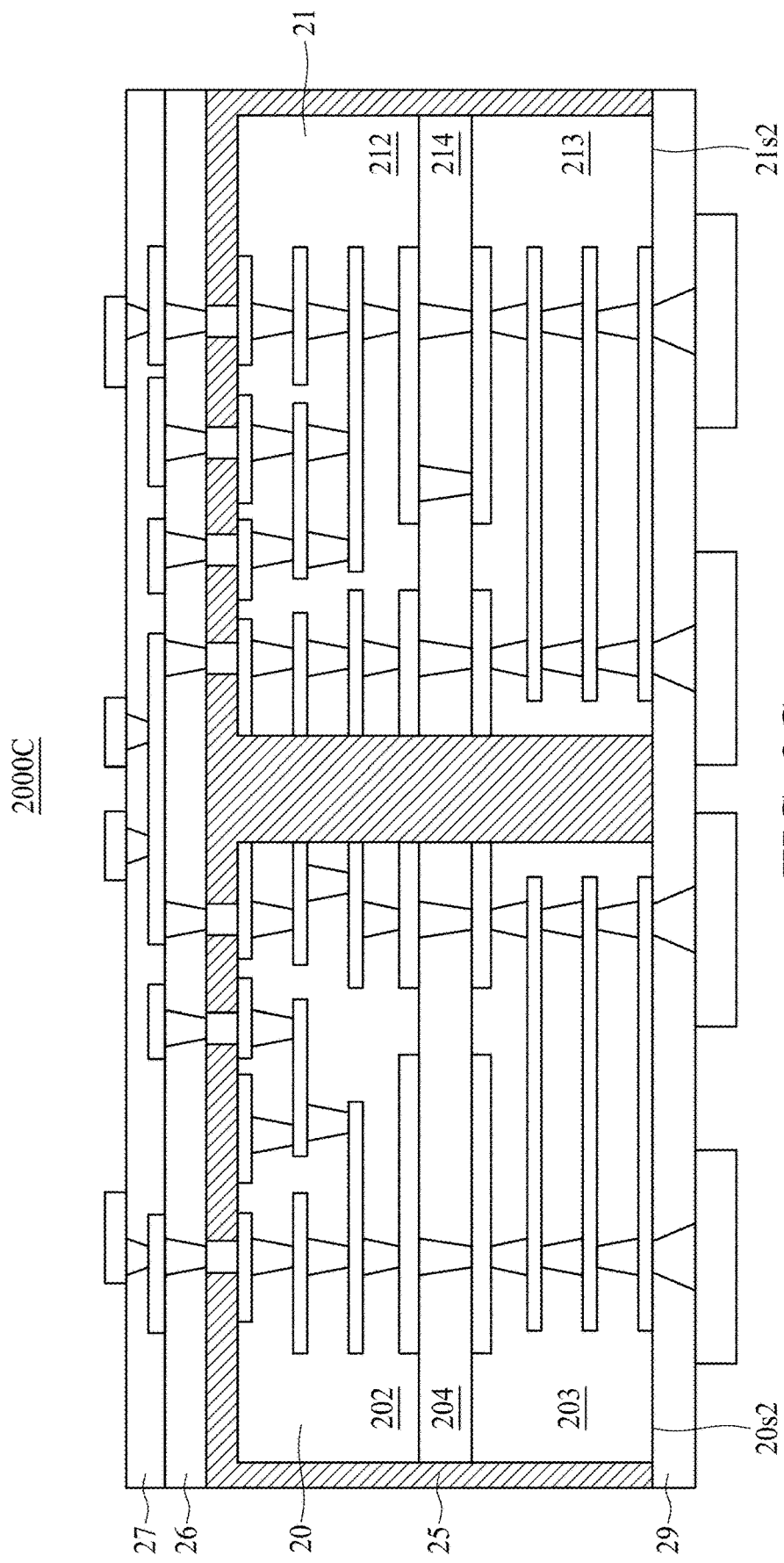
FIG. 3C is a cross-sectional view of a semiconductor package structure in accordance with some embodiments of the present disclosure.

FIG. 3C is a cross-sectional view of a semiconductor package structure 2000C in accordance with some embodiments of the present disclosure. Referring to FIG. 3C, in contrast to the semiconductor package structure 2000A in FIG. 3A, the second reconnection layer 28 of the semiconductor package structure 2000C may be omitted. The second redistribution layer 29 may be disposed on the third surface 20s2 and the fourth surface 21s2.

Figure 4:
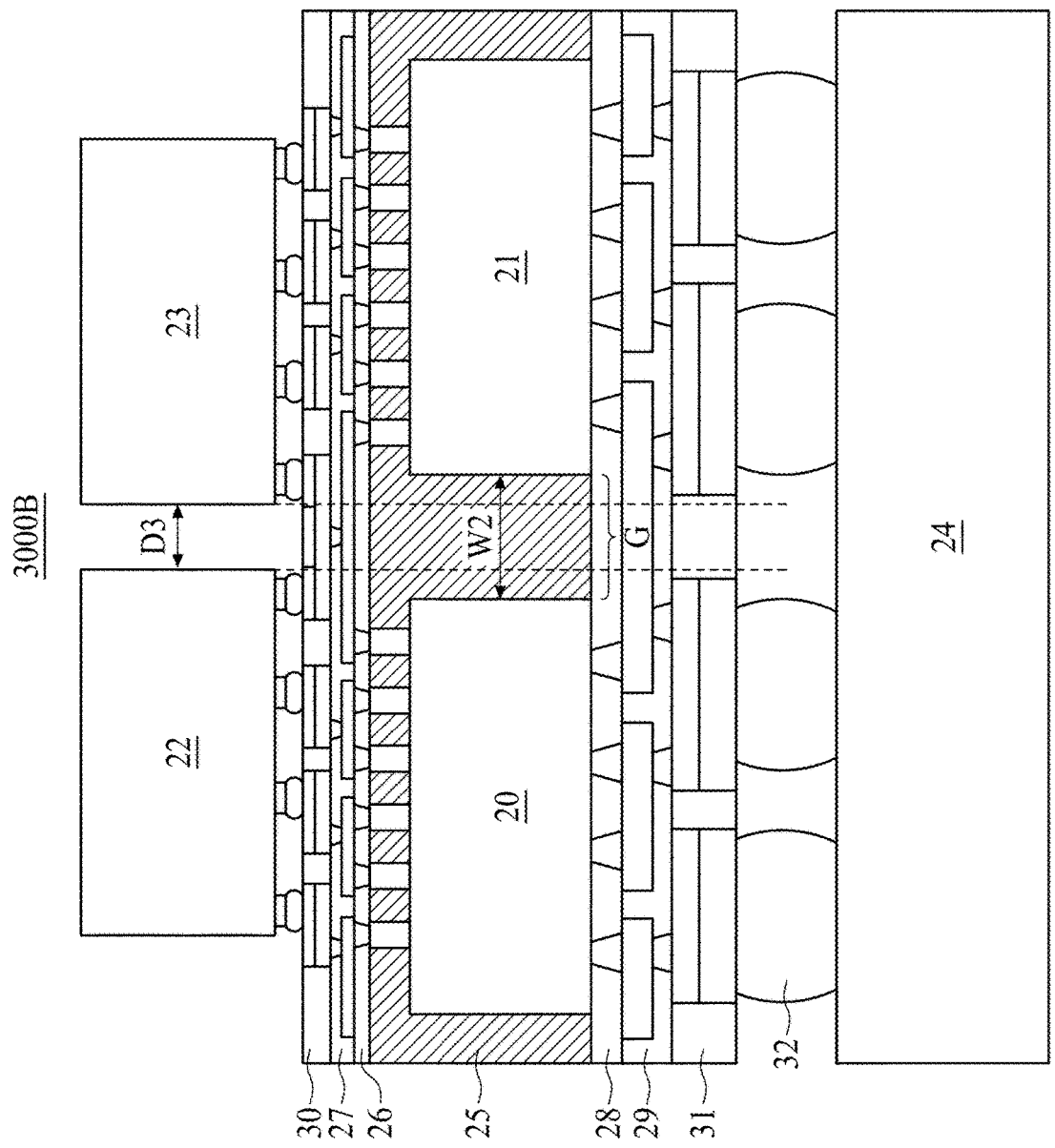
FIG. 4 is a cross-sectional view of a semiconductor device package in accordance with some embodiments of the present disclosure.

FIG. 4 is a cross-sectional view of a semiconductor device package 3000B in accordance with some embodiments of the present disclosure. Referring to FIG. 4, in contrast to the semiconductor package structure 3000A in FIG. 2A, the semiconductor device package 3000B further includes a second semiconductor device 23. The second semiconductor device 23 is separated from the first semiconductor device 22 with a distance D3. The first substrate 20 and the second substrate 21 are spaced part with a gap G. The portion 252 is disposed in the gap G. The portion 252 has a width W2. The distance D3 is smaller than the width W2. In some embodiments, the numbers of the semiconductor devices may be more than two. In some embodiments, the numbers of the substrates may be more than two.

Figure 5:
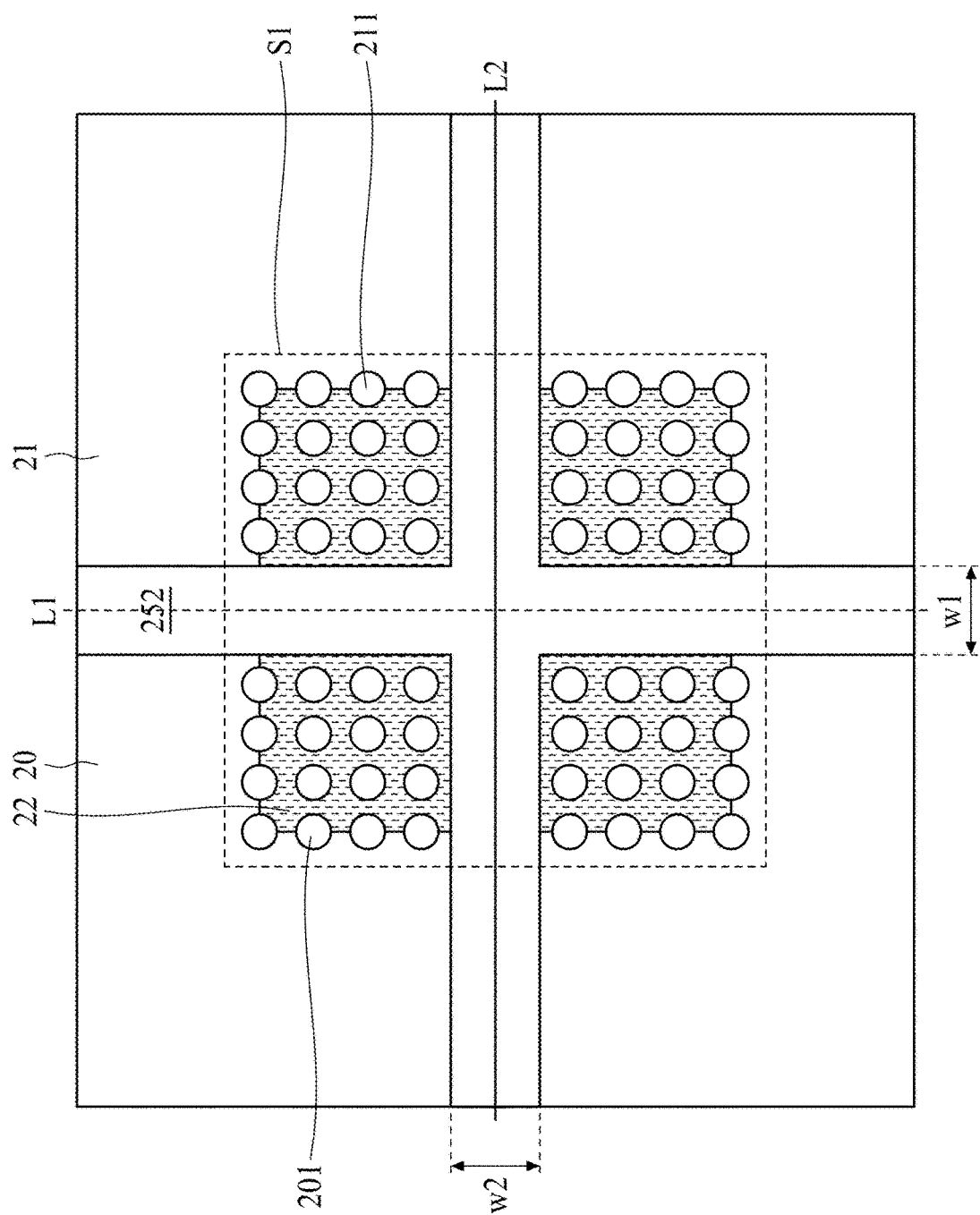
FIG. 5 is a perspective view of a semiconductor device package in accordance with some embodiments of the present disclosure.

FIG. 5 is a perspective view of a semiconductor device package in accordance with some embodiments of the present disclosure. The first semiconductor device 22 is disposed symmetrically with respect to a vertical line L1 and a horizontal line L2. The first substrate 20 and the second substrate 21 are separated by the portion 252 of the dielectric layer 25. As a result, the first and second terminals 201 and 211 are misaligned with the conductive pads 221 and 221' of the first semiconductor device 22. In some embodiments, depending on the partition process, a size of the second substrate 21 can be different from a size of the first substrate 20.

FIG. 6A, FIG. 6B, FIG. 6C, FIG. 6D and FIG. 6E illustrate various stages of a method for manufacturing a semiconductor device package accordance with some embodiments of the subject application.

Figure 6A:
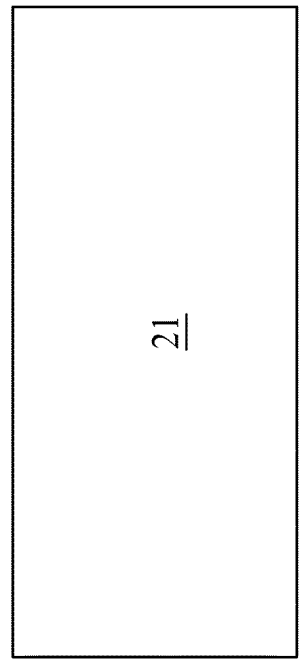
FIG. 6A, FIG. 6B, FIG. 6C, FIG. 6D, and FIG. 6E illustrate various stages of a method for manufacturing a semiconductor device package accordance with some embodiments of the subject application.
Figure 6A:
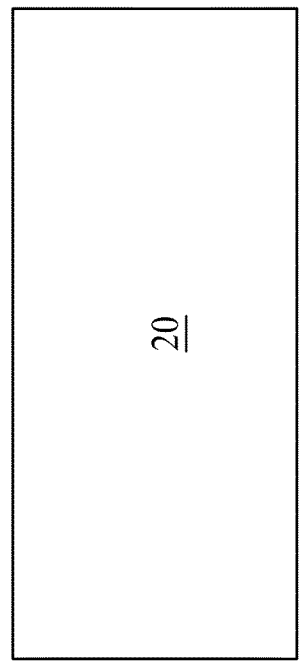
Figure 6B:
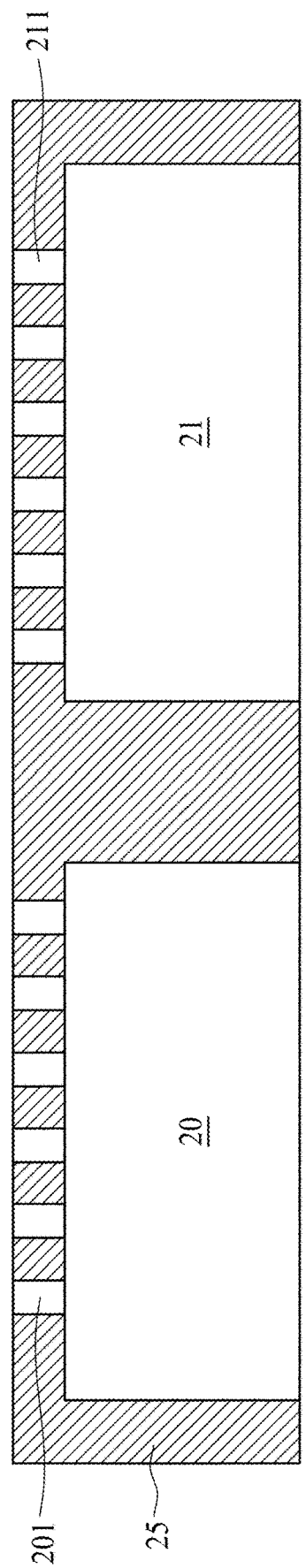

Referring to FIG. 6A, first and second substrates 20 and 21 are singulated from one or more mother substrates. Referring to FIG. 6B, a first terminal 201 is formed on the first substrate 20 and a second terminal 211 is formed on the second substrate 21. A dielectric layer 25 is formed on the first substrate 20 and the second substrate 21 with a gap G between the first substrate 20 and the second substrate 21.

Figure 6C:
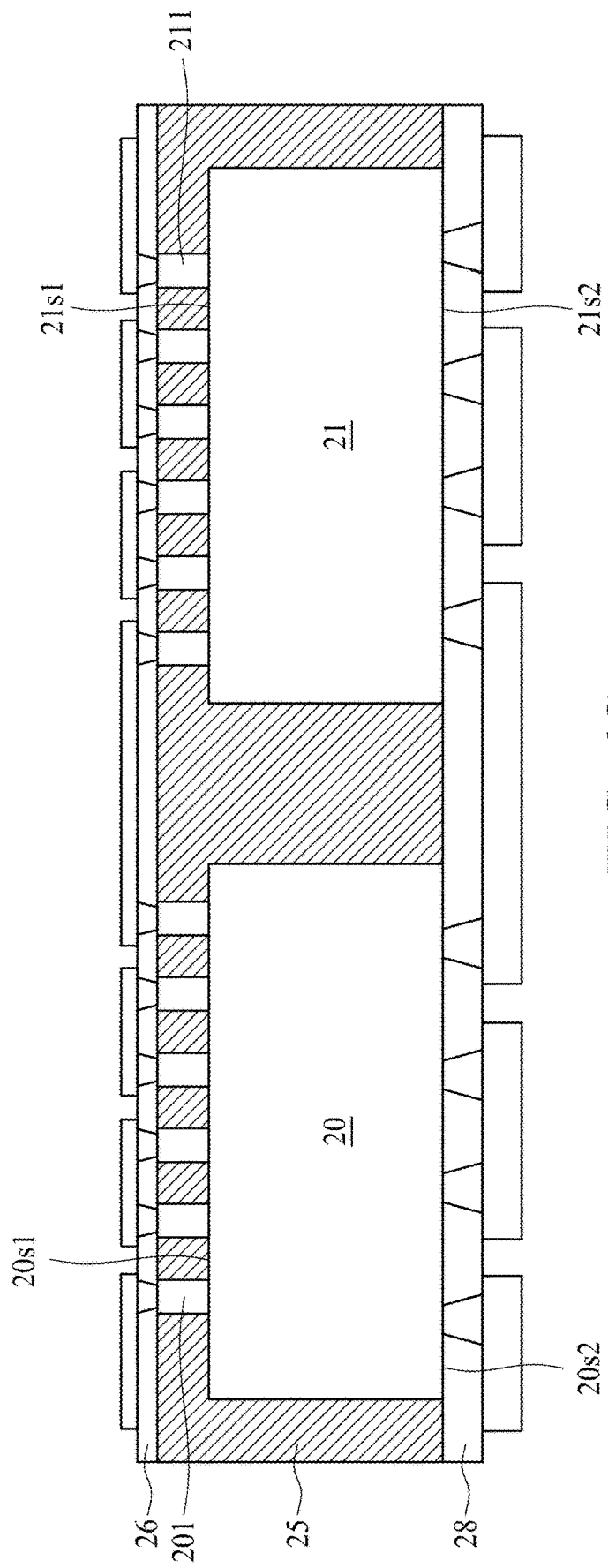

Referring to FIG. 6C, a first reconnection layer 26 is formed on a first surface 20s1 of the first substrate 20 and a second surface 21s1 of the second substrate 21. A second reconnection layer 28 is formed on a third surface 20s2 of the first substrate 20 and a second surface 21s2 of the second substrate 21.

Figure 6D:
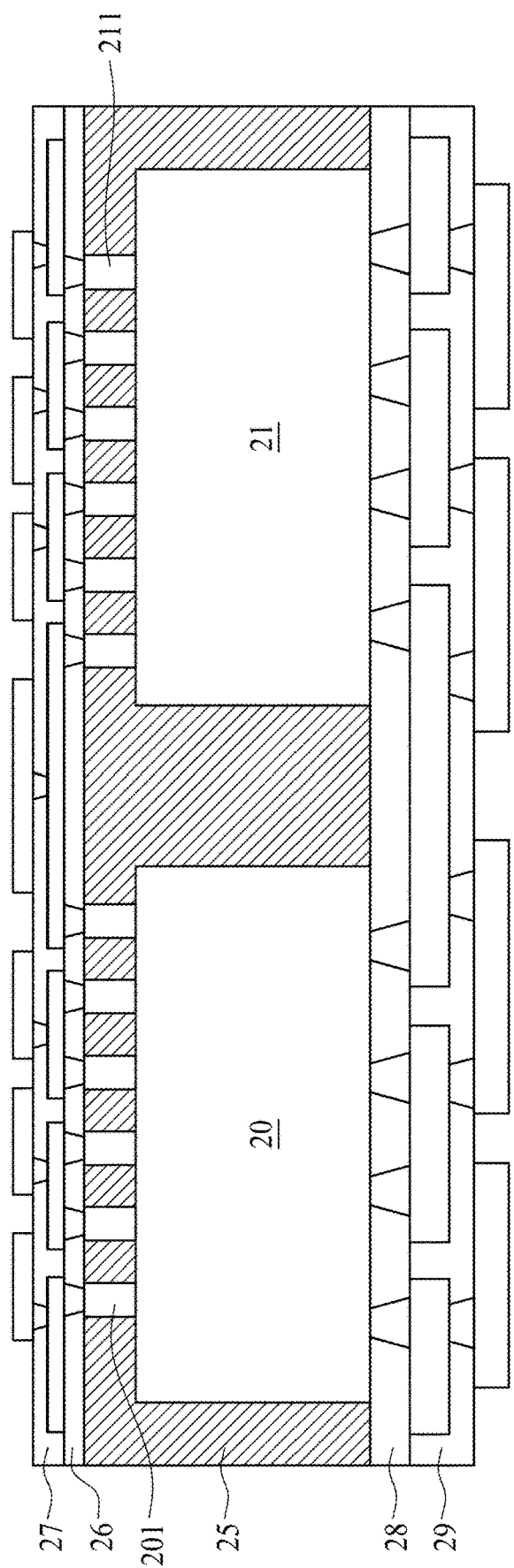
Figure 6E:
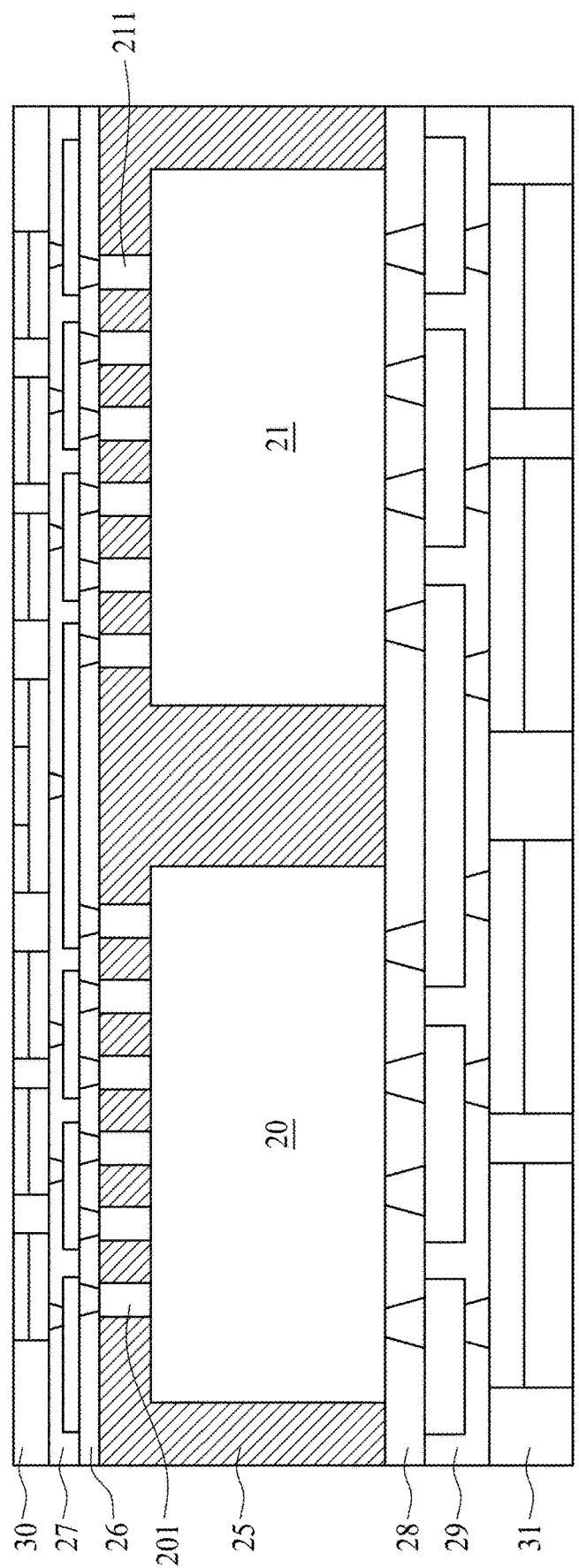

Referring to FIG. 6D, a first redistribution layer 27 is formed on the first reconnection layer 26. A second redistribution layer 29 is formed on the second reconnection layer 28. Referring to FIG. 6E, a first passivation layer 30 is formed on the first redistribution layer 27. A second passivation layer 31 is formed on the second redistribution layer 29.

Afterwards, a semiconductor device 22 is attached to or bonded on the first redistribution layer 27 and a carrier 24 is attached to the second redistribution layer 29 to form the semiconductor device package 3000A described and illustrated with reference to FIG. 2A. Alternatively, a plurality of semiconductor devices 22 and 23 are attached to or bonded on the first redistribution layer 27 and a carrier 24 is attached to the second redistribution layer 29 to form the semiconductor device package 3000B described and illustrated with reference to FIG. 4.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit, and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

As used herein, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event or circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints unless specified otherwise. The term "substantially coplanar" can refer to two surfaces within micrometers (μm) of lying along the same plane, such as within 10 within 5 within 1 or within 0.5 μm of lying along the same plane. When referring to numerical values or characteristics as "substantially" the same, the term can refer to the values lying within ±10%, ±5%, ±1%, or ±0.5% of an average of the values.

A surface can be deemed to be substantially flat if a displacement between the highest point and the lowest point of the surface is no greater than 5 μm, no greater than 2 μm, no greater than 1 μm, or no greater than 0.5 μm.

What is claimed is:
1. A semiconductor package structure, comprising:
a first substrate having a first surface;
a second substrate spaced apart from the first substrate with a gap and having a second surface;
a first redistribution layer disposed above the first surface and the second surface;

a first reconnection layer disposed between the first redistribution layer and the gap;

a dielectric layer disposed between the first reconnection layer and the first substrate and between the first reconnection layer and the second substrate, wherein the dielectric layer contacts the first surface and a lateral surface of the first substrate, and the second surface and a lateral surface of the second substrate;

a second redistribution layer; and a semiconductor device disposed above the first redistribution layer and the first reconnection layer, wherein the first substrate is electrically connected to the second substrate via the first reconnection layer, a wiring density of the first redistribution layer is greater than a wiring density of the second redistribution layer, and a thickness of a second conductive layer of the second redistribution layer is greater than a thickness of a first conductive layer of the first redistribution layer.

2. The semiconductor package structure of claim 1, wherein the first substrate and the second substrate are free of semiconductor material.

3. The semiconductor package structure of claim 2, wherein the first redistribution layer includes a first conductive via tapering in a direction from the first redistribution layer to the first substrate and the second substrate, wherein the semiconductor package structure further comprises the second redistribution layer on a third surface of the first substrate opposite to the first surface and a fourth surface of the second substrate opposite to the second surface, and wherein the second redistribution layer includes a second conductive via tapering in a direction toward the first substrate and the second substrate.

4. The semiconductor package structure of claim 3, wherein the second conducive via has a width greater than a width of the first conductive via.

5. The semiconductor package structure of claim 4, wherein a thickness of a second conductive layer of the second redistribution layer is greater than a thickness of the first conductive layer of the first redistribution layer.

6. The semiconductor package structure of claim 5, wherein the semiconductor device electrically connects the first redistribution layer through a first conductive element, and the semiconductor package structure further comprises a second conductive element disposed on the second redistribution layer, wherein the second conductive element has a width greater than a width of the first conductive element.

7. The semiconductor package structure of claim 3, wherein the semiconductor device electrically connected to the second redistribution layer through the first substrate and the second substrate.

8. The semiconductor package structure of claim 7, wherein the first redistribution layer includes a wiring structure establishing communication between the first substrate and the second substrate, wherein the wiring structure is closer to the gap than other portions of the first redistribution layer.

9. The semiconductor package structure of claim 8, wherein the dielectric layer is a monolithic structure.

10. The semiconductor package structure of claim 9, further comprising a plurality of terminals disposed on one of the first substrate and the second substrate, wherein the dielectric layer is disposed between the plurality of terminals.

11. A semiconductor device package, comprising:
a first substrate including a plurality of first terminals protruding from a first surface of the first substrate;

a second substrate including a plurality of second terminals protruding from a second surface of the second substrate, wherein the second substrate is separated from the first substrate with a space in a first direction;

an encapsulant encapsulating the first substrate and the second substrate, wherein the encapsulant contacts the first surface and a lateral surface of the first substrate, and the second surface and a lateral surface of the second substrate, wherein the encapsulant is disposed between the plurality of first terminals and between the plurality of second terminals, and wherein the encapsulant is a monolithic structure;

a first redistribution layer disposed adjacent to an upper surface of the encapsulant, and including a first wiring structure electrically connecting the first substrate and the second substrate;

a second redistribution layer, wherein a wiring density of the first redistribution layer is greater than a wiring density of the second redistribution layer, and a thickness of a second conductive layer of the second redistribution layer is greater than a thickness of a first conductive layer of the first redistribution layer.

12. The semiconductor device package of claim 11, wherein the encapsulant extends into the space and in contact with the lateral surface of the first substrate facing the space and the lateral surface of the second substrate facing the space.

13. The semiconductor device package of claim 12, wherein the redistribution layer is a multi-layer structure, and wherein the first wiring structure is located above and closest to the space.

14. The semiconductor device package of claim 11, further comprising the second redistribution layer disposed below a lower surface of the encapsulant opposite to the upper surface of the encapsulant.

15. The semiconductor device package of claim 11, further comprising a second wiring structure embedded in the first substrate, the second wiring structure electrically connect the first surface and a third surface opposite to the first surface.

16. A method of manufacturing a semiconductor device package, including:
providing a plurality of substrates, wherein each of the plurality of substrates includes a plurality of terminals protruding from an upper surface of each of the plurality of substrates;

encapsulating a lateral surface, the upper surface, and the plurality of terminals of each of the plurality of substrates, and encapsulating a gap between adjacent substrates;

forming a first redistribution layer on the encapsulation layer, and the first redistribution layer including a wiring structure electrically connecting the plurality of substrates; and forming a second redistribute layer, wherein a wiring density of the first redistribution layer is greater than a wiring density of the second redistribution layer, and a thickness of a second conductive layer of the second redistribution layer is greater than a thickness of a first conductive layer of the first redistribution layer.

17. The method of claim 16, further including:
forming a second redistribution layer below the encapsulation layer, wherein a wiring density of the first redistribution layer is greater than a wiring density of the second redistribution layer.

18. The method of claim 16, wherein the wiring structure establishes communication between the first substrate and the second substrate, wherein the wiring structure is above the gap and closer to the gap than other portions of the first redistribution layer.

\* \* \* \* \*